United States Patent
Timm

(10) Patent No.: US 6,246,389 B1
(45) Date of Patent: Jun. 12, 2001

(54) SIMULATING ANALOG DISPLAY SLEW RATE INTENSITY VARIATIONS IN A DIGITAL GRAPHICS DISPLAY

(75) Inventor: Daniel P. Timm, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 08/868,272

(22) Filed: Jun. 3, 1997

(51) Int. Cl.$^7$ ........................................... G09G 5/36
(52) U.S. Cl. ................................. 345/134; 345/133
(58) Field of Search ........................ 345/134, 133, 345/112, 113, 147, 148, 12, 20; 341/122–123, 143; 324/102, 121 R; 702/66, 67; 364/550

(56) References Cited

U.S. PATENT DOCUMENTS

| | | | |
|---|---|---|---|
| 4,455,613 | * 6/1984 | Shoemaker | 364/487 |
| 4,510,571 | * 4/1985 | Dagostino et al. | 364/487 |
| 4,639,879 | * 1/1987 | Chaya | 364/518 |
| 4,719,416 | * 1/1988 | Desautels | 324/121 R |
| 4,727,364 | * 2/1988 | Vorst | 340/747 |
| 4,829,293 | 5/1989 | Schlater | 340/722 |
| 4,940,931 | 7/1990 | Katayama et al. | 324/121 |
| 4,972,138 | * 11/1990 | Bush | 324/73.1 |
| 5,065,147 | 11/1991 | Rice et al. | 340/744 |
| 5,162,723 | * 11/1992 | Marzalek et al. | 324/77 B |
| 5,434,593 | * 7/1995 | Lecklider et al. | 345/134 |
| 5,440,676 | 8/1995 | Alappat et al. | 395/143 |
| 5,444,459 | * 8/1995 | Moriyasu | 345/133 |
| 5,467,128 | * 11/1995 | Yates et al. | 348/187 |
| 5,548,539 | * 8/1996 | Vlach et al. | 364/578 |
| 5,550,963 | 8/1996 | Siegel et al. | 395/140 |
| 5,579,463 | * 11/1996 | Takano et al. | 395/140 |
| 5,675,581 | * 10/1997 | Soliman | 370/252 |
| 5,684,508 | * 11/1997 | Brilman | 345/134 |
| 5,706,203 | * 1/1998 | Kawauchi | 364/487 |
| 5,754,439 | * 5/1998 | Holcomb et al. | 364/487 |
| 5,790,096 | * 8/1998 | Hlill, Jr. | 345/150 |
| 5,852,789 | * 12/1998 | Trsa et al. | 701/102 |
| 5,854,996 | * 12/1998 | Overhage et al. | 702/189 |
| 5,898,307 | * 5/1999 | Taraki et al. | 324/379 |
| 5,910,112 | * 6/1999 | Judd et al. | 600/410 |
| 5,959,607 | * 9/1999 | Montijo | 345/134 |
| 5,978,742 | * 11/1999 | Pickerd | 702/66 |
| 5,986,637 | * 11/1999 | Etheridge et al. | 345/134 |

* cited by examiner

*Primary Examiner*—Bipin Shalwala
*Assistant Examiner*—Vanel Frenel

(57) ABSTRACT

A method of determining an intensity value for a pixel in a display for displaying digitized waveforms. The intensity values simulate an analog display so that intensity at high slew rates about a point is lower than intensity at low slew rates about a point. Intensity may be computed as a function of slew rate. Alternatively, for speed, the absolute difference between waveform magnitudes at consecutive samples is used as an index into a pre-computed table of intensity values. As a result, for each sample, only a subtraction and a table look-up are needed to provide intensity variation. In an alternative embodiment, intensity values are higher at higher slew rates to accentuate rising and falling edges of digital waveforms.

18 Claims, 4 Drawing Sheets

SIMULATING ANALOG DISPLAY SLEW RATE INTENSITY VARIATIONS IN A DIGITAL GRAPHICS DISPLAY

FIELD OF INVENTION

This invention relates generally to digital graphics displays and more specifically to display of digitized waveforms in instruments such as digital oscilloscopes, heart monitors and spectrum analyzers.

BACKGROUND OF THE INVENTION

Oscilloscopes, spectrum analyzers, heart monitors and other electronic instruments often use an analog vector cathode-ray tube (CRT) to display waveform information. In the typical analog vector CRT, an electron beam sweeps at a fixed speed in one direction while being deflected by an analog signal at a variable speed in a perpendicular direction. Analog CRTs have an inherent intensity variation as a function of the velocity of the electron beam across the face of the display (slew rate) and the intensity build-up and decay times (persistence) of the phosphors used in the display. A waveform being displayed on an analog CRT has a high intensity where the slew rate of the electron beam is relatively slow and may have a lower intensity where the slew rate is relatively high. In general, this intensity variation provides useful information to a human observer. In particular, intensity provides a visual clue as to rate of change. High intensity indicates slow change and low intensity indicates rapid change. For example, if a square wave is displayed on an analog display oscilloscope, the vertical rate of change of the waveform is much higher than the horizontal sweep rate so that the high levels and the low levels of the square wave are typically at a high intensity and the rising and falling edges of the square wave are at a lower intensity.

Instruments may also use digital graphics displays similar to the displays used for most computer monitors. A digital graphics display is divided into rows and columns of addressable areas called pixels. The intensity of each pixel in a digital graphics display is typically controlled by a digital value stored in a memory associated with the display. In an instrument using a digital graphics display, a waveform is sampled, the samples are converted into digital values and the digital values are stored into an acquisition memory. The waveform samples determine which pixels are illuminated but the samples do not inherently control intensity. Any intensity variation must be accomplished as a digital computation on digital waveform data, typically by post processing the waveform image. In many systems, display update speed is a critical requirement and software post processing typically requires a relatively complex and time consuming computational burden. Alternatively, specialized hardware for high speed vector drawing may include intensity variation. A system is needed that provides intensity variation for slew rate with high speed, simplicity and low cost.

SUMMARY OF THE INVENTION

Slew rate based intensity variations mimicking analog vector CRT behavior are used when rendering waveforms on digital graphics displays. Slew rate based intensity variations may be computed algorithmically. Alternatively, for speed, the slew rate may be estimated and look-up tables may be used to determine the intensity. The slew rate of a signal, about a point, is estimated based on measuring the magnitude of the vertical change of the waveform between consecutive samples. A smaller vertical waveform change means a lower slew rate about the point and intensity is set to a higher value. A larger vertical waveform change means a higher slew rate about the point and intensity is set to a lower value. A look-up table is used for intensity of a point or line segment as a function of vertical waveform change about the point. Therefore, computation is reduced to a single subtraction and a table look-up.

In an alternative embodiment, the table of intensity as a function of slew rate is reversed so that a point or line segment having a higher slew rate has higher intensity and a point or line segment having lower slew rate has lower intensity. The alternative embodiment is particularly useful, for example, for viewing digital waveforms where timing of rising and falling edges is of particular interest.

DETAILED DESCRIPTION OF THE PREFERRED EMBODIMENT OF THE INVENTION

Figure 1:
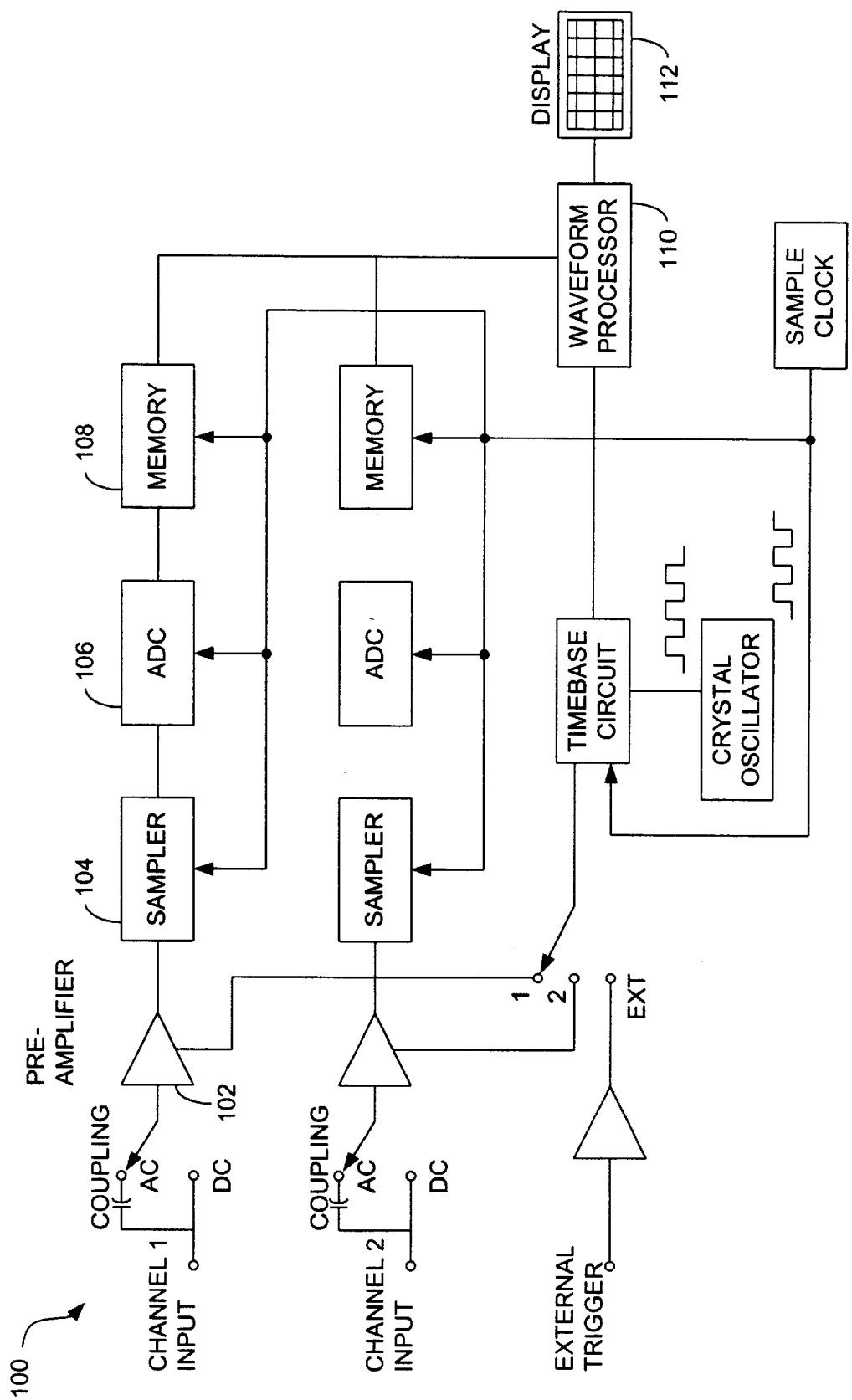
FIG. 1 is a block diagram of a digital oscilloscope including an example embodiment of the invention.

FIG. 1 illustrates a typical digital instrument for acquiring and displaying electronic waveforms. In FIG. 1, an analog signal 100 is amplified by an amplifier 102, sampled by a sample-and-hold circuit 104, the samples are converted into numerical values by an analog-to-digital converter 106, the numerical values are stored in an acquisition memory 108, the numerical values are processed by a waveform processor 110 and finally the resulting images are displayed on a display 112.

Figure 2:
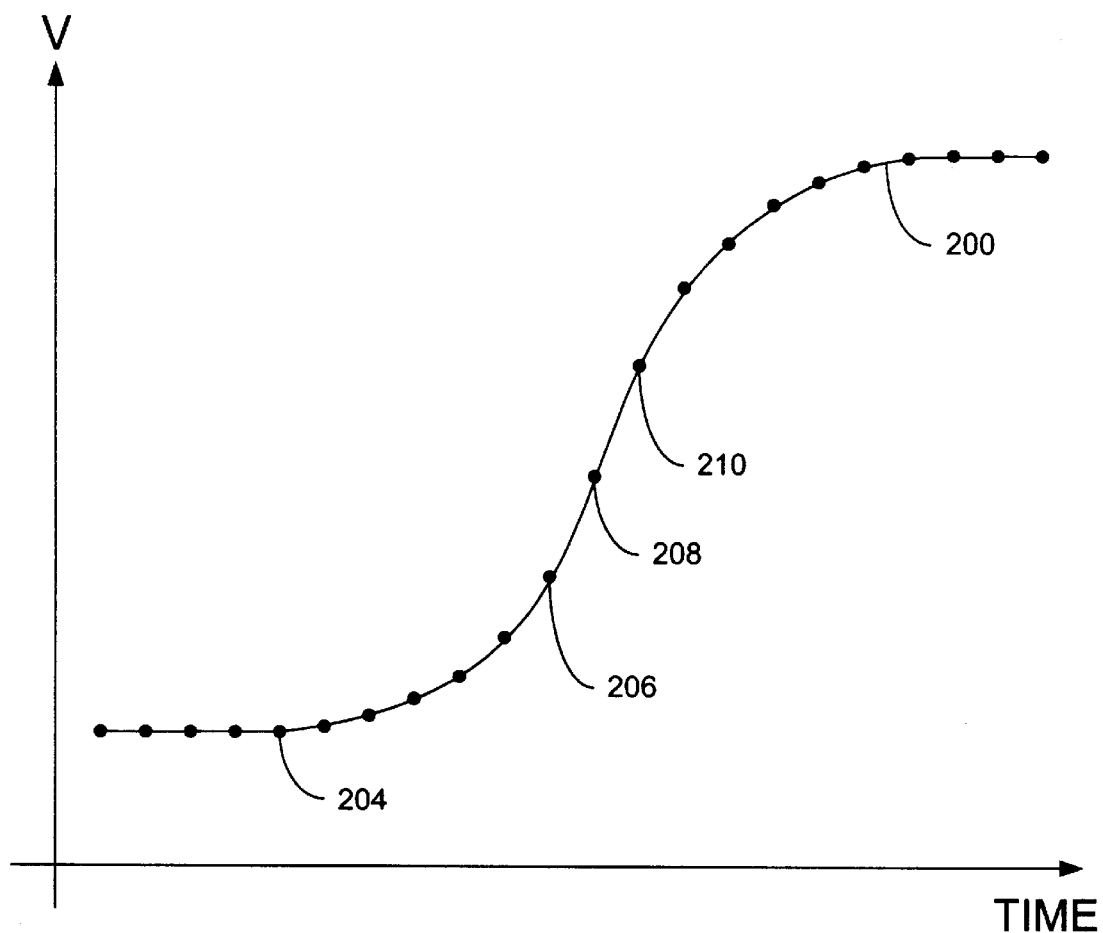
FIG. 2 is a graph of a waveform to be displayed.

FIG. 2 is a graph of an analog voltage waveform 200 as a function of time. In digital instruments, the waveform 200 is sampled, as depicted in FIG. 2 by dots on the waveform 200. When digitized and displayed, the dots may be displayed as isolated points, or the dots may be connected by interpolated straight lines, or the dots may be connected by various computed curved lines. Note that the waveform is depicted in FIG. 2 as a voltage waveform, but the waveform may represent any measurable time varying phenomena.

For a CRT, a phosphor on the face of the tube is excited by an electron beam. The phosphor has finite intensity build-up and decay times. If the electron beam moves slowly relative to the build-up time, the intensity is high. As the electron beam slew rate increases relative to the phosphor build-up time, the intensity decreases. If waveform 200 is displayed on a typical instrument CRT, the display at point 204 will be a higher intensity than the display at point 206 because the slew rate of the electron beam is lower at point 204 relative to the slew rate at point 206. The slew rate at point 206 is the derivative of voltage with respect to time at point 206. The slew rate between point 206 and point 208 may be approximated by the magnitude of the vertical change in the waveform from point 206 to point 208 divided by the time interval between point 206 and point 208. In an analog CRT display, intensity is approximately proportional to the inverse of slew rate (lower slew rate results in higher intensity). Therefore, to approximately emulate an analog CRT, intensity may be made proportional to the time interval between samples divided by the magnitude of the vertical change in the waveform between samples. In FIG. 2, the time interval between samples is approximately constant. Therefore, the intensity may be made proportional to the inverse of the magnitude of the vertical change of waveform between samples. The intensity (as approximately proportional to the inverse of the magnitude of the vertical change of the waveform) can be computed in an algorithmic fashion. However, for speed, a table can be computed of intensity as a function of the magnitude of the vertical change in the waveform. It should be noted that in some oscilloscopes, the sampling interval is deliberately slightly varied dynamically to reduce aliasing. However, for purposes of the present patent document, the variability in sampling interval is sufficiently small that the variability can be ignored and a table based on fixed sample intervals still results in an acceptable intensity mapping.

In an instrument in accordance with a first example embodiment of the invention, slew rate, and the intensity of a CRT phosphor as a function of slew rate, are approximated in a simple look-up table. The index into the table is the magnitude of vertical change between sample points. A curve may be fitted through the points and small increments of the curve may be used. For faster speed, just the actual sample points may be used. At each point, there are three choices for measuring vertical change: forward looking, backward looking and symmetrical. For a forward looking measurement, the intensity of a point is determined by the vertical change between the point and the next adjacent point. For example, in FIG. 2, for a forward looking measurement the intensity of point 208 is determined by the vertical change between point 208 and point 210. For a backward looking measurement, the intensity of a point is determined by the vertical change between the point and the previous adjacent point. For example, in FIG. 2, for a backward measurement the intensity of point 208 is determined by the vertical change between point 208 and point 206. For a symmetrical measurement, the intensity of a point is determined by the vertical change between the previous adjacent point and the next adjacent point. For example, in FIG. 2, for a symmetrical measurement, the intensity of point 208 is determined by the vertical change between point 206 and point 210.

Similarly, for line segments, the intensity of a line can be determined by a vertical change computation at the beginning of the line, a vertical change computation in the center of the line, or a vertical change computation at the end of the line. Preferably, for forward or backward measurements, each line segment includes a sample point at only one end. For example, for a forward looking line segment, the line segment preferably includes a sample point at the beginning of the line segment but does not include a sample point at the end of the line segment. As a result, intensity may change at each sample point along a series of connected segments and the intensity of each segment is determined by a single measurement. With symmetrical measurement and line segments, an algorithm is needed to uniquely determine the intensity of line segments between adjacent points. For example, intensity for a point may be used for a line segment that goes halfway between the point and the preceding point and for a line segment that goes halfway between the point and the next point. Intensity changes would then occur between sample points.

Figure 3:
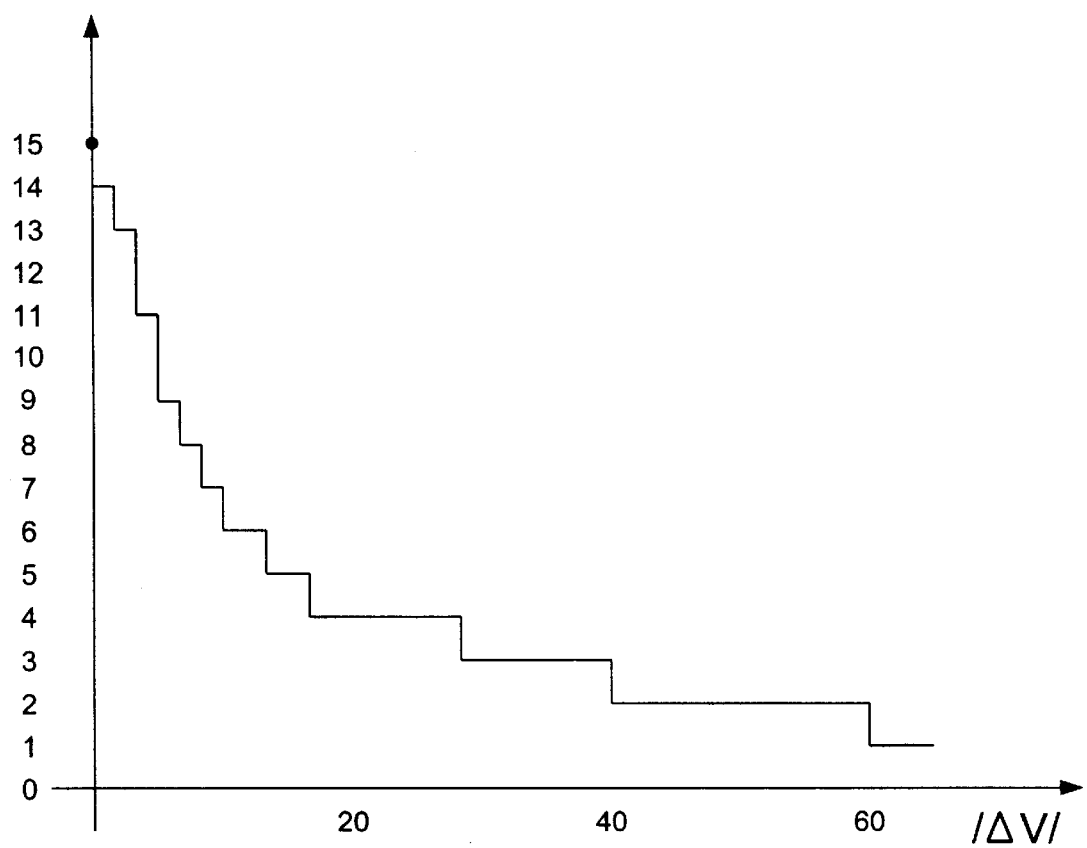
FIG. 3 is a graph of intensity versus vertical waveform change in accordance with the invention.

FIG. 3 is a graph of intensity as a function of forward looking vertical change for an example embodiment of the invention. The intensity axis (vertical) represents a decimal range from 0–15, with 15 being maximum intensity. The horizontal axis represents the absolute value of a difference between two 8-bit numbers (digitized voltages) with a decimal range of 0–255. Differences greater than 63 are truncated to 63. The graph has approximately the shape of $1/(\Delta V)$ but is empirically modified to also approximate phosphor response time. That is, the curve has been tuned so that a resulting digital display visually matches an analog display. In general, any non-zero intensity values should be visible to a human observer. Therefore, in some implementations, the minimum non-zero numerical intensity value may need to be greater than 1.0. The actual numerical values for an example embodiment corresponding to FIG. 3 are given in Appendix A. Forward looking measurement is used for the example of FIG. 3 but backward looking or symmetrical approaches are equally acceptable. The particular numerical ranges for the vertical and horizontal axes in FIG. 3 are used for example purposes and other ranges are equally acceptable.

Referring again to FIGS. 1 and 2, at each digitized waveform point, for example, point 206, waveform processor 110 subtracts the value of a first point (206) from the value of the next point (208) (forward looking), uses the computed absolute difference as an index into a table having values as in Appendix A, and uses the resulting intensity value from the table for displaying the first point. If points are connected, the line segment connecting the point to the appropriate end point for the line segment is given the intensity of the point.

Figure 4:
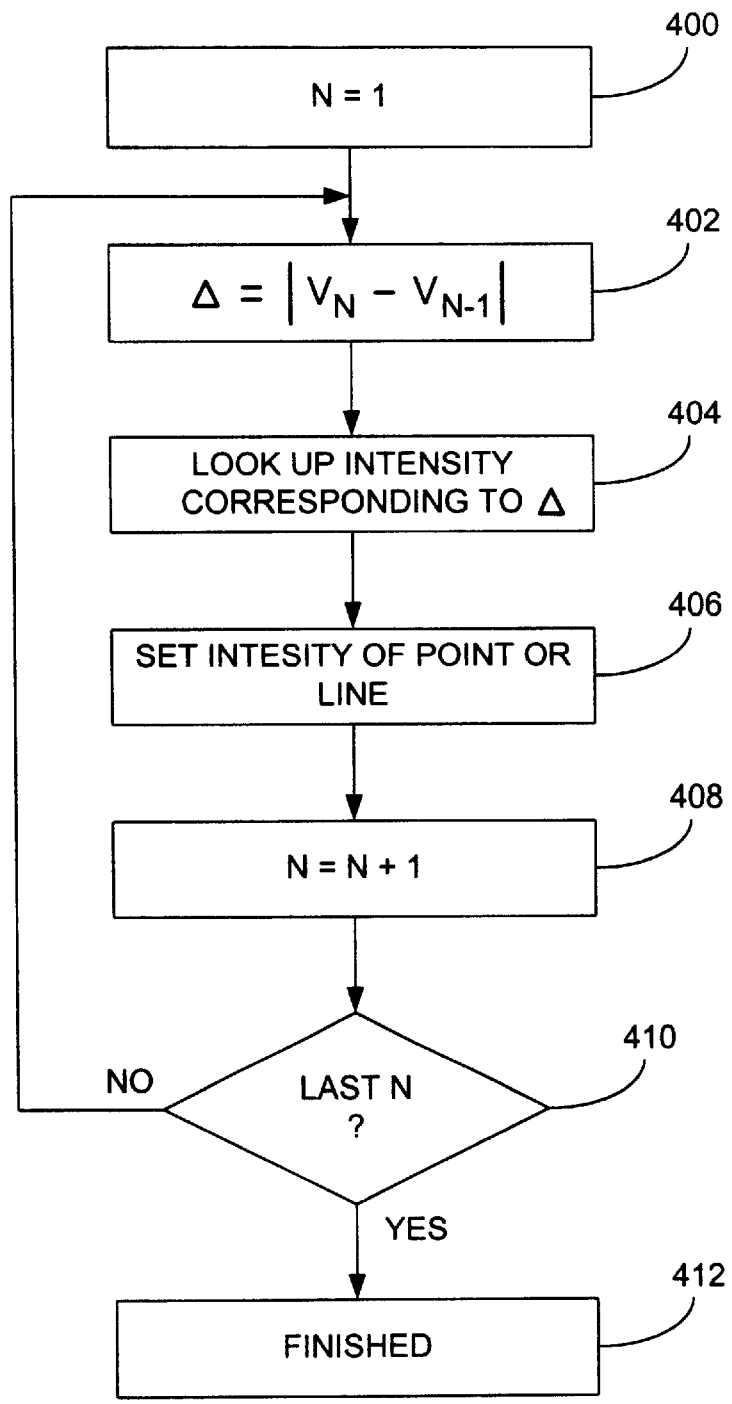
FIG. 4 is flow chart of a method in accordance with the invention.

FIG. 4 is a flow chart of the process for displaying an entire waveform record consisting of multiple sample points. Starting at an initial sample index N (step 400), the absolute difference between consecutive digitized waveform samples is computed (step 402). The difference from step 402 is used as an index into a table (step 404). The corresponding intensity from the table is used for the first of the two waveform samples used in the computation or for the next line segment being displayed (step 406). The sample index is incremented (step 408) and tested to see if there are remaining sample points (step 410). If there are no remaining sample points, the process is complete (step 412).

In contrast to an analog vector CRT, making intensity a general function of slew rate with a raster display can facilitate flexibility by providing a variety of behaviors. For example, when viewing digital waveforms, the areas of interest are often the leading and falling edges. Therefore, it is useful for digital waveforms to accentuate a higher slew rate with a higher intensity and to display a lower slew rate with a lower intensity, thereby accentuating the rising and falling edges. This may be accomplished by either inverting the vertical axis of the table or by subtracting the result of a table look-up from the maximum intensity value.

In summary, a method of simulating analog slew rate intensity variations is provided that, for each point or line segment, requires only a subtraction and a table look-up. No additional hardware is required. In addition, by changing the look-up table, versatile behaviors may be implemented that are not possible with an analog vector display.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

APPENDIX A

| ΔV | INTENSITY | ΔV | INTENSITY | ΔV | INTENSITY |
|---|---|---|---|---|---|
| 0 | 15 | 22 | 4 | 43 | 3 |
| 1 | 14 | 23 | 4 | 44 | 2 |
| 2 | 13 | 24 | 4 | 45 | 2 |
| 4 | 11 | 25 | 4 | 46 | 2 |
| 5 | 9 | 26 | 4 | 47 | 2 |
| 6 | 8 | 27 | 4 | 48 | 2 |
| 7 | 8 | 28 | 4 | 49 | 2 |
| 8 | 7 | 29 | 3 | 50 | 2 |
| 9 | 7 | 30 | 3 | 51 | 2 |
| 10 | 6 | 34 | 3 | 52 | 2 |
| 11 | 6 | 32 | 3 | 53 | 2 |
| 12 | 6 | 33 | 3 | 54 | 2 |
| 13 | 5 | 34 | 3 | 55 | 2 |
| 14 | 5 | 35 | 3 | 56 | 2 |
| 15 | 5 | 36 | 3 | 57 | 2 |
| 16 | 5 | 37 | 3 | 58 | 2 |
| 17 | 5 | 38 | 3 | 59 | 2 |
| 18 | 5 | 39 | 3 | 60 | 2 |
| 19 | 4 | 40 | 3 | 61 | 1 |
| 20 | 4 | 41 | 3 | 62 | 1 |
| 21 | 4 | 42 | 3 | 63 | 1 |

What is claimed is:

1. A method for determining an intensity of a pixel in a display system for displaying a digitized waveform, the method comprising the following steps:
   (a) determining a first numeric value of a first sample of the digitized waveform, the first sample being displayed at the pixel;
   (b) determining a second numeric value of a second sample of the digitized waveform;
   (c) computing an estimate of the slew rate from the first sample to the second sample;
   (d) computing an intensity corresponding to the slew rate of step (c); and
   (e) using the intensity of step (d) for the pixel.

2. The method of claim 1, step (d) further comprising:
   the relationship between slew rate and intensity such that increasing slew rate results in decreasing intensity.

3. The method of claim 1, step (d) further comprising:
   the relationship between slew rate and intensity such that increasing slew rate results in increasing intensity.

4. The method of claim 1:
   step (c) further comprising:
      (c1) computing the absolute value of the difference between the first and second numeric values; and
   step (d) further comprising:
      (d1) using the result of step (c1) as an index into a look-up table of intensity values to determine an intensity value for the first sample.

5. The method of claim 1 further comprising:
   (f) connecting the first and second samples with a line segment; and
   (g) using the intensity of step (d) for all pixels used to display the line segment.

6. The method of claim 5, step (g) further comprising:
   not using the intensity of step (d) for an end pixel on the line segment corresponding to the second sample.

7. A method for determining an intensity of a pixel in a display system for displaying a digitized waveform, the method comprising the following steps:
   (a) determining a first numeric value of a first sample of the digitized waveform;
   (b) determining a second numeric value of a second sample of the digitized waveform, the second sample being displayed at the pixel;
   (c) determining a third numeric value of a third sample of the digitized waveform;
   (d) computing an estimate of the slew rate from the first sample to the third sample;
   (e) computing an intensity corresponding to the slew rate of step (d); and
   (f) using the intensity of step (e) for the pixel.

8. The method of claim 7, step (e) further comprising:
   the relationship between slew rate and intensity such that increasing slew rate results in decreasing intensity.

9. The method of claim 7, step (e) further comprising:
   the relationship between slew rate and intensity such that increasing slew rate results in increasing intensity.

10. The method of claim 7:
    step (d) further comprising:
       (d1) computing the absolute value of the difference between the first and third numeric values; and
    step (e) further comprising:
       (e1) using the result of step (d) as an index into a look-up table of intensity values to determine an intensity value for the second sample.

11. The method of claim 7, the pixel being one of a plurality of pixels in a line segment, the method further comprising:
    (g) displaying the plurality of pixels in the line segment using the intensity of step (e).

12. The method of claim 11, step (g) further comprising:
    not using the intensity of step (e) for an end pixel on the line segment.

13. The method of claim 11, the line segment being from the first sample to the second sample.

14. The method of claim 11, the line segment being from the second sample to the third sample.

15. The method of claim 11, the line segment extending from the second sample toward the first sample and from the second sample toward the third sample.

16. A display system for displaying a digitized waveform comprising:
    a plurality of pixels;
    means for determining a first numeric value of a first sample of the digitized waveform, the first sample being displayed at one of the pixels;
    means for determining a second numeric value of a second sample of the digitized waveform;
    means for computing an estimate of the slew rate from the first sample to the second sample;
    means for computing an intensity corresponding to the slew rate; and
    means for using the intensity for said one of the pixels.

17. The display system of claim 16 further comprising:
    means for computing the absolute value of the difference between the first and second numeric values; and
    means for using the result of the absolute value of the difference between the first and second numeric values to determine an intensity value for the first sample.

18. The display system of claim 16 further comprising:
    means for connecting the first and second samples with a line segment; and
    means for using the intensity value determined for the first sample at all of the pixels used to display the line segment.

* * * * *